United States Patent
Hayashi et al.

(10) Patent No.: US 9,082,593 B2
(45) Date of Patent: Jul. 14, 2015

(54) ELECTRODE HAVING GAS DISCHARGE FUNCTION AND PLASMA PROCESSING APPARATUS

(75) Inventors: Daisuke Hayashi, Tokyo (JP); Toshifumi Ishida, Tokyo (JP); Norihiko Amikura, Tokyo (JP)

(73) Assignee: TOKYO ELECTRON LIMITED (JP)

( * ) Notice: Subject to any disclaimer, the term of this patent is extended or adjusted under 35 U.S.C. 154(b) by 231 days.

(21) Appl. No.: 13/435,689

(22) Filed: Mar. 30, 2012

(65) Prior Publication Data

US 2012/0247673 A1 Oct. 4, 2012

Related U.S. Application Data

(60) Provisional application No. 61/477,183, filed on Apr. 20, 2011.

(30) Foreign Application Priority Data

Mar. 31, 2011 (JP) ................................. 2011-078214
Mar. 28, 2012 (JP) ................................. 2012-073431

(51) Int. Cl.
| | |
|---|---|
| *C23C 16/455* | (2006.01) |
| *C23C 16/50* | (2006.01) |
| *C23C 16/503* | (2006.01) |
| *C23C 16/505* | (2006.01) |
| *C23C 16/509* | (2006.01) |

(Continued)

(52) U.S. Cl.
CPC ......... *H01J 37/32449* (2013.01); *C23C 16/455* (2013.01); *C23C 16/45563* (2013.01); *C23C 16/45565* (2013.01); *C23C 16/45576* (2013.01); *C23C 16/50* (2013.01); *C23C 16/503* (2013.01); *C23C 16/505* (2013.01); *C23C 16/509* (2013.01); *H01J 1/02* (2013.01); *H01J 37/32532* (2013.01); *C23F 1/12* (2013.01); *H01J 1/00* (2013.01)

(58) Field of Classification Search
CPC ............ C23C 16/455; C23C 16/45563; C23C 16/45565; C23C 16/45576; C23C 16/50; C23C 16/503; C23C 16/505; C23C 16/509; C23F 1/12; H01J 1/00
USPC ....... 118/715 E; 156/345.43–345.45, 345.47, 156/345.33–345.34
See application file for complete search history.

(56) References Cited

U.S. PATENT DOCUMENTS

| | | | | |
|---|---|---|---|---|
| 5,200,016 A | * | 4/1993 | Namose | 156/345.25 |
| 5,332,464 A | * | 7/1994 | Namose | 438/9 |

(Continued)

FOREIGN PATENT DOCUMENTS

JP 2006-287162 10/2006

*Primary Examiner* — Rudy Zervigon
(74) *Attorney, Agent, or Firm* — Cantor Colburn LLP

(57) ABSTRACT

An electrode having a gas discharge function, where the degree of freedom related to a maximum gas flow rate is abundant, an electrode cover member may be thinned, and a change of a gas behavior according to time is difficult to be generated in a processing chamber during gas introduction. The electrode includes: a base material having a plurality of gas holes; and an electrode cover member having a plurality of gas holes respectively corresponding to the plurality of gas holes of the base material in a one-to-one manner, fixed to the base material, and disposed facing a processing space in which the object is plasma-processed, wherein a gas hole diameter of the electrode cover member is larger than a gas hole diameter of the base material.

19 Claims, 21 Drawing Sheets

(51) Int. Cl.
*C23F 1/00* (2006.01)
*H01J 37/32* (2006.01)
*H01J 1/02* (2006.01)
*C23F 1/12* (2006.01)
*H01J 1/00* (2006.01)

(56) References Cited

U.S. PATENT DOCUMENTS

| | | | |
|---|---|---|---|
| 5,792,269 A * | 8/1998 | Deacon et al. | 118/715 |
| 6,048,435 A * | 4/2000 | DeOrnellas et al. | 156/345.44 |
| 6,207,007 B1 * | 3/2001 | Segawa et al. | 156/345.26 |
| 6,565,661 B1 * | 5/2003 | Nguyen | 118/715 |
| 7,270,713 B2 * | 9/2007 | Blonigan et al. | 118/715 |
| 7,296,534 B2 * | 11/2007 | Fink | 118/723 E |
| 7,827,931 B2 * | 11/2010 | Matsushima et al. | 118/723 E |
| 7,850,779 B2 * | 12/2010 | Ma et al. | 118/715 |
| 8,161,906 B2 * | 4/2012 | Kadkhodayan et al. | 118/723 E |
| 8,298,336 B2 * | 10/2012 | Wang et al. | 118/715 |
| 8,313,805 B2 * | 11/2012 | Kadkhodayan et al. | 427/248.1 |
| 8,425,682 B2 * | 4/2013 | Wang et al. | 118/715 |
| 2003/0209323 A1 * | 11/2003 | Yokogaki | 156/345.34 |
| 2004/0058070 A1 * | 3/2004 | Takeuchi et al. | 427/282 |
| 2005/0133161 A1 * | 6/2005 | Carpenter et al. | 156/345.34 |
| 2006/0225655 A1 * | 10/2006 | Faguet et al. | 118/723 R |
| 2006/0228889 A1 * | 10/2006 | Edelberg et al. | 438/689 |
| 2006/0288934 A1 * | 12/2006 | Takahashi et al. | 118/715 |
| 2007/0119370 A1 * | 5/2007 | Ma et al. | 118/723 E |
| 2007/0119371 A1 * | 5/2007 | Ma et al. | 118/723 E |
| 2007/0128862 A1 * | 6/2007 | Ma et al. | 438/680 |
| 2007/0128863 A1 * | 6/2007 | Ma et al. | 438/680 |
| 2007/0128864 A1 * | 6/2007 | Ma et al. | 438/680 |
| 2007/0131171 A1 * | 6/2007 | Takatsuki et al. | 118/723 R |
| 2008/0185104 A1 * | 8/2008 | Brcka | 156/345.29 |
| 2008/0242085 A1 * | 10/2008 | Fischer et al. | 438/680 |
| 2008/0268171 A1 * | 10/2008 | Ma et al. | 427/569 |
| 2009/0071407 A1 * | 3/2009 | Kuznetsov | 118/728 |
| 2010/0178775 A1 * | 7/2010 | Okesaku et al. | 438/726 |
| 2011/0198034 A1 * | 8/2011 | Sun et al. | 156/345.34 |
| 2012/0193456 A1 * | 8/2012 | Lubomirsky et al. | 239/548 |
| 2012/0247673 A1 * | 10/2012 | Hayashi et al. | 156/345.33 |

* cited by examiner

PROCESSING SPACE

ELECTRODE HAVING GAS DISCHARGE FUNCTION AND PLASMA PROCESSING APPARATUS

CROSS-REFERENCE TO RELATED PATENT APPLICATIONS

This application claims the benefit of Japanese Patent Application No. 2011-078214 filed on Mar. 31, 2011 in the Japan Patent Office, U.S. Patent Application No. 61/477,183 filed on Apr. 20, 2011 in the U.S. Patent and Trademark Office, and Japanese Patent Application No. 2012-073431 filed on Mar. 28, 2012 in the Japan Patent Office, the disclosures of which are incorporated herein in their entireties by reference.

BACKGROUND OF THE INVENTION

1. Field of the Invention

The present invention relates to an electrode having a gas discharge function and a plasma processing apparatus.

2. Description of the Related Art

A plasma process, such as a plasma etching process or a plasma chemical vapor deposition (CVD) process, is used to manufacture a semiconductor integrated circuit apparatus. A typical plasma processing apparatus includes an upper electrode and a lower electrode in a processing chamber, and plasmatizes a processing gas in the processing chamber by applying radio frequency power to at least one of the upper and lower electrodes.

Such a plasma processing apparatus is disclosed, for example, in Patent Reference 1.

Patent Reference 1 discloses a plasma etching device, where an upper electrode of the plasma etching device has a gas discharge function and is a composite electrode including a replaceable electrode cover member at a processing space.

In the composite electrode, a gas hole diameter of the replaceable electrode cover member is equal to or smaller than a gas hole diameter of an electrode cover member at a base. The gas hole diameter of the replaceable electrode cover member is smaller so that the electrode cover member at the base is not damaged by plasma.

However, according to such a composite electrode, since the gas hole diameter of the replaceable electrode cover member is smaller than the gas hole diameter of the electrode cover member at the base, a differential pressure (stress) may be applied to the replaceable electrode cover member during gas discharge. When the differential pressure is applied, the replaceable electrode cover member may break, and thus in reality, a thickness of the replaceable electrode cover member is increased or a maximum gas flow rate is limited so as to suppress "break of an electrode cover member". Accordingly, an electrode cover member cannot be thinned, and thus reduction of manufacturing costs is hindered and the degree of freedom related to the maximum gas flow rate is limited.

Also, a gas discharge rate introduced in a processing chamber is determined by a gas hole of an electrode cover member at a processing space, which has smaller conductance than a gas hole of a base material. However, the gas hole at the processing space is damaged by plasma. When the gas hole is damaged and is widened in a horn shape, the gas discharge rate is changed. In other words, in a configuration where a gas hole of an electrode cover member at a processing space determines a gas discharge rate, a gas behavior changes as time passes in the processing chamber during gas introduction.

3. Prior Art Reference (Patent Reference 1) Japanese Laid-Open Patent Publication No. 2006-287162

SUMMARY OF THE INVENTION

The present invention provides an electrode having a gas discharge function, where the degree of freedom related to a maximum gas flow rate is abundant, an electrode cover member may be thinned, and a change of gas behavior according to time is difficult to be generated in a processing chamber during gas introduction, and a plasma processing apparatus including the electrode.

According to an aspect of the present invention, there is provided an electrode having a gas discharge function, which is used in a plasma processing apparatus and disposed facing an electrode on which an object is held, the electrode having the gas discharge function including: a base material having a plurality of gas holes; and an electrode cover member fixed to the base material, disposed facing a processing space in which the object is plasma-processed, and having a plurality of gas holes respectively corresponding to the plurality of gas holes of the base material in a one-to-one manner, wherein a gas hole diameter of the electrode cover member is larger than a gas hole diameter of the base material.

According to another aspect of the present invention, there is provided an electrode having a gas discharge function, used in a plasma processing apparatus and disposed facing an electrode on which an object is held, the electrode having the gas discharge function including: a base material having a plurality of gas holes; and an electrode cover member having a plurality of gas hole groups, fixed to the base material, and disposed facing a processing space in which the object is plasma-processed, wherein each gas hole group of the electrode cover member has a plurality of gas holes, and the plurality of gas holes in one gas hole group of the electrode cover member correspond to one gas hole of the plurality of gas holes of the base material in a many-to-one manner.

According to another aspect of the present invention, there is provided a plasma processing apparatus including: a processing chamber in which a process is performed on an object; a holding stage formed in the processing chamber, on which the object is held, and serving as an electrode; and an electrode having a gas discharge function, formed in the processing chamber, and disposed facing the holding stage, wherein one of the above the electrodes having the gas discharge function is used as the electrode having the gas discharge function.

BRIEF DESCRIPTION OF THE DRAWINGS

The above and other features and advantages of the present invention will become more apparent by describing in detail exemplary embodiments thereof with reference to the attached drawings in which.

DETAILED DESCRIPTION OF THE INVENTION

Figure 1:
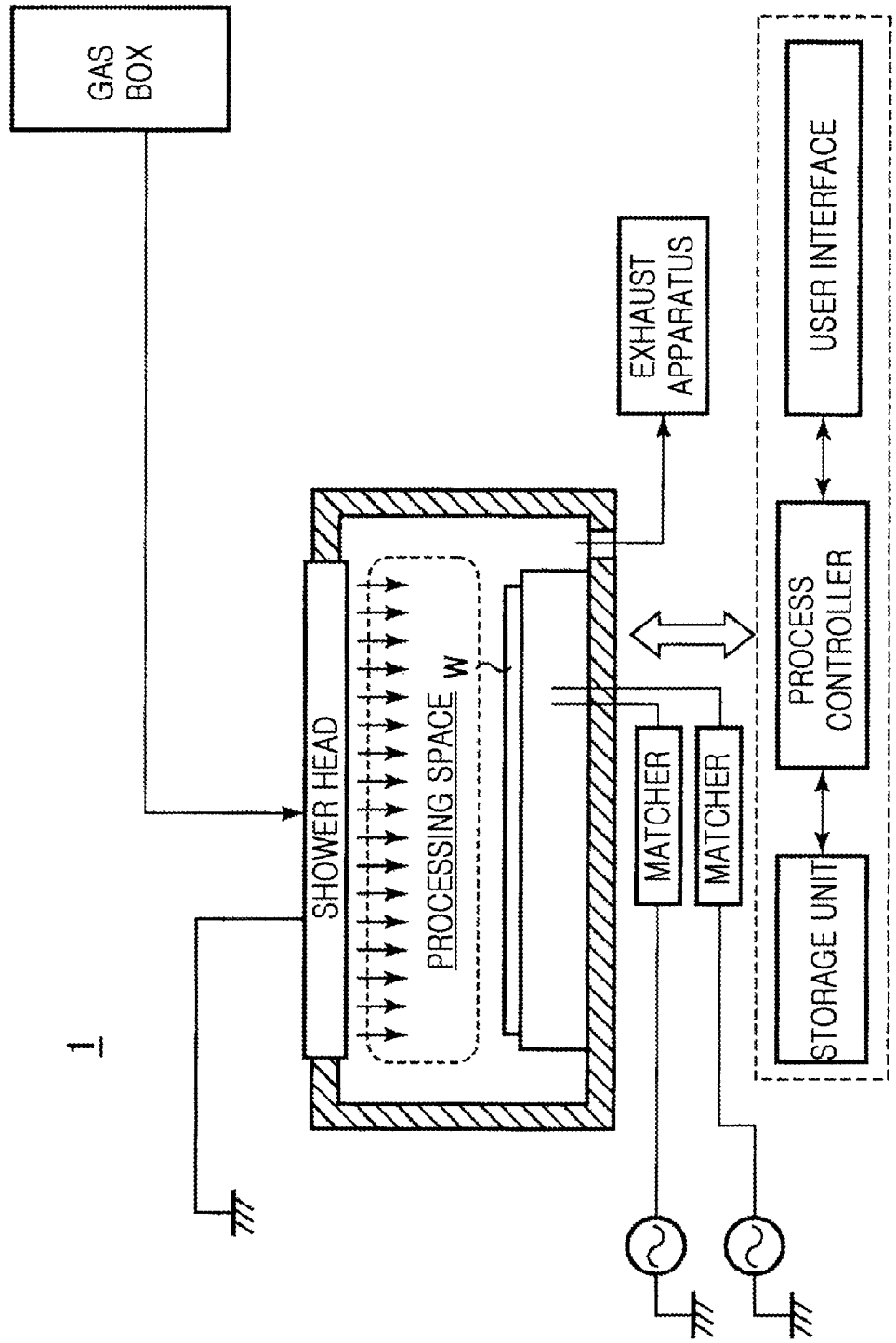
FIG. 1 is a cross-sectional view schematically showing a plasma processing apparatus according to an embodiment of the present invention.

Hereinafter, the present invention will be described in detail by explaining exemplary embodiments of the invention with reference to the attached drawings. Like reference numerals in the drawings denote like elements.

FIG. 1 is a cross-sectional view schematically showing a plasma processing apparatus 1 according to an embodiment of the present invention.

As shown in FIG. 1, a processing apparatus is a parallel plate type plasma processing apparatus 1. The plasma processing apparatus 1 includes a processing chamber 2 performing a plasma etching process or a plasma film-forming process on an object, in the present embodiment, a semiconductor wafer W, by using a processing gas, and a processing gas supply source, in the present embodiment, a gas box 3, supplying the processing gas to the processing chamber 2.

In the processing chamber 2, a holding stage 4 on which the semiconductor wafer W is held, and an electrode having a processing gas discharge function, in the present embodiment, a shower head 5, disposed to face the holding stage 4 and discharging the processing gas to the inside of the processing chamber 2 are formed. The shower head 5 is connected to the gas box 3 through a gas supply pipe 31.

The shower head 5 forms an upper electrode of a parallel plate, and in the present embodiment, is connected to ground potential.

Meanwhile, the holding stage 4 forms a lower electrode of the parallel plate, and in the present embodiment, is connected to a first radio frequency power supply 8 and a second radio frequency power supply 9 respectively through matchers 6 and 7. The first radio frequency power supply 8 outputs, for example, a radio frequency of 100 MHz, and the second radio frequency power supply 9 outputs, for example, a radio frequency of 3.2 MHz.

Also, the processing chamber 2 is connected to an exhaust apparatus 11 through an exhaust hole 10. The processing chamber 2 is configured as a vacuum container capable of depressurizing an inner space to a desired vacuum level. The exhaust apparatus 11 exhausts the inside of the processing chamber 2 configured as a vacuum container, and depressurizes the inside of the processing chamber 2 to a desired vacuum level.

The plasma processing apparatus 1 is controlled by, for example, a process controller 100 including a microprocessor (computer). A user interface 101 and a storage unit 102 are connected to the process controller 100. The user interface 101 includes a keyboard where an operator performs an input manipulation or the like of a command to manage the plasma processing apparatus 1, a display visualizing and displaying an operating state of the plasma processing apparatus 1, or the like. The storage unit 102 stores a control program for realizing a process executed in the plasma processing apparatus 1 via control of the process controller 100, or a program for executing a process on each element of the plasma processing apparatus 1 according to process conditions, i.e., the storage unit 102 stores a recipe. The recipe is, for example, stored in a storage medium in the storage unit 102. The storage medium may be a hard disk or a semiconductor memory, or a portable medium, such as a CD-ROM, DVD, or a flash memory. Alternatively, the recipe may be suitably transferred to the storage unit 102 from another apparatus through, for example, an exclusive wire. When occasion commands, the recipe is read from the storage unit 102 according to a command from the user interface 101, and a process according to the read recipe is performed by the process controller 100, and thus the plasma processing apparatus 1 performs a desired process under the control of the process controller 100.

Figure 2:
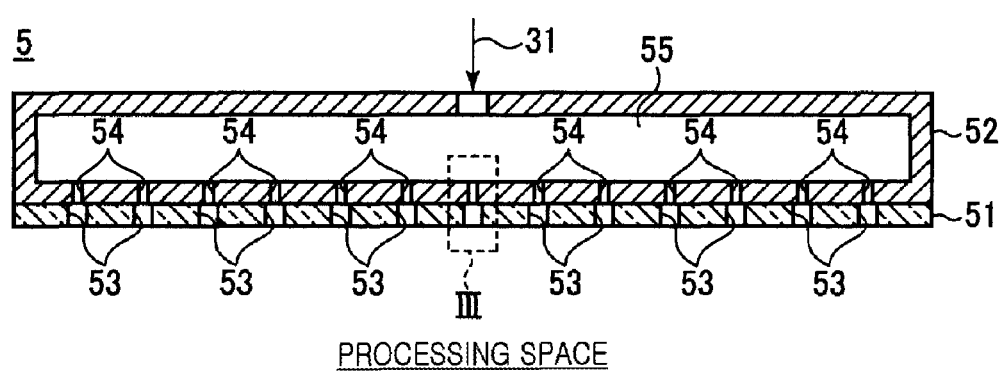
FIG. 2 is a cross-sectional view schematically showing an electrode (shower head) having a gas discharge function included in a plasma processing apparatus, according to an embodiment of the present invention.

FIG. 2 is a cross-sectional view schematically showing an electrode having a gas discharge function included in a plasma processing apparatus, according to an embodiment of the present invention.

As shown in FIG. 2, the electrode having the gas discharge function, in the present embodiment, the shower head 5, includes an electrode cover member 51 disposed to face a processing space for plasma-processing the wafer W, and a base material 52 formed of a metal material, for example, an aluminum material, to which the electrode cover member 51 is fixed. The electrode cover member 51 has a plurality of gas holes 53, and the base material 52 also has a plurality of gas holes 54 respectively corresponding to the plurality of gas holes 53 of the electrode cover member 51.

A gas diffusion space 55 is formed inside the base material 52. A side (top surface) of the gas diffusion space 55 opposite to the processing space is connected to the gas supply pipe 31, and the processing gas is supplied to the gas diffusion space 55 from the gas box 3. A side (bottom surface) of the gas diffusion space 55 facing the processing space is connected to the plurality of gas holes 54. The processing gas supplied to the gas diffusion space 55 is transmitted to the plurality of gas holes 54.

The electrode cover member 51 is detachably fixed to, for example, a bottom surface of the base material 52, and is replaceable if damaged by plasma. The replaceable electrode cover member 51 is formed of, for example, a brittle material. Examples of the brittle material include a material including at least any one of quartz, alumina, an yttrium sintered-body, aluminum nitride, silicon nitride, silicon carbide, silicon, and calcium fluoride.

The plurality of gas holes 53 of the electrode cover member 51 are respectively connected to the gas holes of the base material 52, and the processing gas transmitted to the plurality of gas holes 54 is transmitted to the plurality of gas holes 53 to be discharged toward the processing space.

First Embodiment

Figure 3:
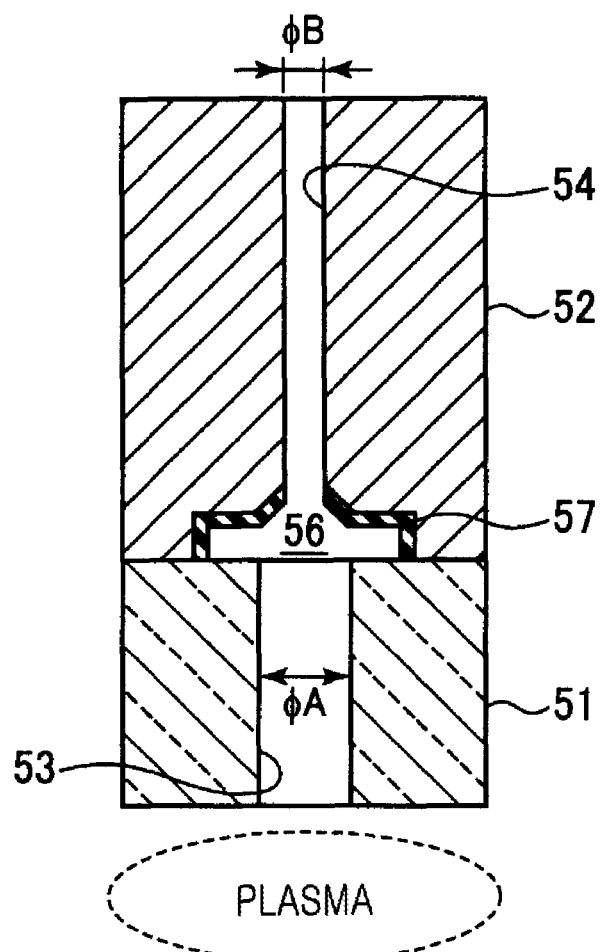
FIG. 3 is a magnified view of an example of an inside of a broken line frame III of FIG. 2, according to a first embodiment of an electrode having a gas discharge function.

FIG. 3 is a magnified view of an example of an inside of a broken line frame III of FIG. 2, according to a first embodiment of an electrode having a gas discharge function.

As shown in FIG. 3, in the present embodiment, a gas hole diameter φA of the gas hole 53 of the electrode cover member 51 is larger than a gas hole diameter φB of the gas hole 54 of the base material 52. For example, the gas hole diameter φA exceeds the gas hole diameter φB and less than or equal to three times of the gas hole diameter φB.

The reason why the gas hole diameter φA exceeds the gas hole diameter φB is to increase conductance of the gas hole 53 of the electrode cover member 51 higher than conductance of the gas hole 54 of the base material 52. As such, by setting the conductance of the gas hole 53 of the electrode cover member 51 higher than the conductance of the gas hole 54 of the base material 52, a differential pressure (stress) due to the processing gas is not applied to the electrode cover member 51 during gas discharge. In order to obtain the benefit that the differential pressure due to the processing gas is not applied, the gas hole diameter φA may be equal to or more than 1.5 times of the gas hole diameter φB.

According to the present embodiment where the different pressure due to the processing gas is not applied to the electrode cover member 51, breaking of the electrode cover member 51 due to the differential pressure may not be considered. Accordingly, a maximum gas flow rate is not limited, and the degree of freedom related to the maximum gas flow rate may be improved.

Also, since the differential pressure is not applied to the electrode cover member 51, the electrode cover member 51 may be thinned. Even the thin electrode cover member 51 having a thickness of 3 mm to 15 mm can be realized.

Also, in the present embodiment, since the conductance of the gas hole 53 of the electrode cover member 51 is higher than the conductance of the gas hole 54 of the base material 52, a discharge rate of the processing gas introduced into the processing chamber 2 is determined by the gas hole 54 of the base material 52. Accordingly, it is difficult to change the discharge rate of the processing gas even if the electrode cover member 51 is damaged by plasma, and the gas hole 53 of the electrode cover member 51 is widened to a horn shape. In other words, in the present embodiment, the discharge rate of the processing gas is not determined by the gas hole 53 of the electrode cover member 51 facing the processing space, but by the gas hole 54 of the base material 52. By using such a structure, in the present embodiment, a circumstance that a gas behavior changes as time passes in a processing chamber during gas introduction may be suppressed.

Also, in the present embodiment, the reason why the gas hole diameter φA is less than or equal to three times of the gas hole diameter φB is because, since the gas hole 53 faces the processing space, if the gas hole diameter φA is excessively large, plasma may be generated in the gas hole 53. In order to suppress generation of plasma in the gas hole 53, the gas hole diameter φA may be less than or equal to about three times of the gas hole diameter φB, according to plasma generating conditions and process conditions.

Also, the gas hole diameter φA of the gas hole 53 of the electrode cover member 51 may be, for example, from 1 mm to 2 mm.

Also, in the present embodiment, a clearance portion 56 having a concave shape larger than the gas hole diameter φA of the gas hole 53 of the electrode cover member 51 may be formed at a surface of the gas hole 54 of the base material 52 attached to the electrode cover member 51. By forming such a clearance portion 56, the small gas hole 54 of the base material 52 may be definitely communicated to the gas hole 53 of the electrode cover member 51 even when an attached location of the electrode cover member 51 to the base material 52 is misaligned, or a gas hole is misaligned due to a difference of thermal expansion.

Also, in the present embodiment, the gas hole 53 of the electrode cover member 51 is large. Thus, charged particles, for example, electrons and ions, in plasma may deeply move into the gas hole 53, thereby damaging the base material 52 or generating an abnormal discharge in a composite electrode having a gas discharge function including the base material 52 and the electrode cover member 51, in the present embodiment, the shower head 5. Accordingly, for example, an abrasion tolerant coating process may be performed on a surface of the clearance portion 56 having the concave shape attached to the electrode cover member 51. FIG. 3 shows a coating film 57 formed by the abrasion tolerant coating process. The coating film 57 includes at least any one of, for example, an yttrium oxide sprayed coating film, an alumina sprayed coating film, an yttrium fluoride sprayed coating film, and an anodized coating film.

Second Embodiment

Figure 4:
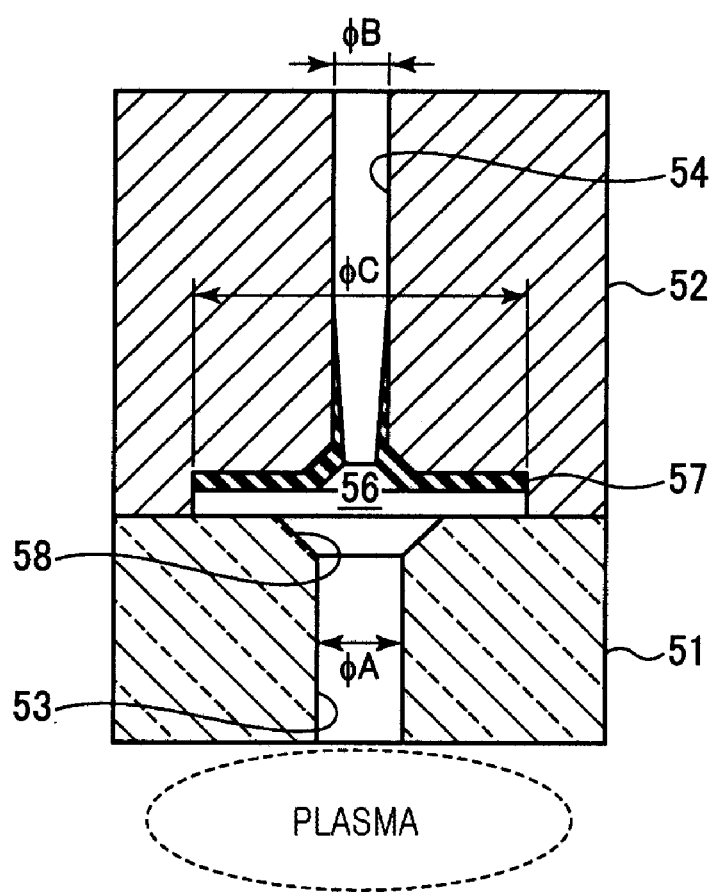
FIG. 4 is a magnified view of an example of the inside of the broken line frame III of FIG. 2, according to a second embodiment of an electrode having a gas discharge function.

FIG. 4 is a magnified view of an example of the inside of the broken line frame III of FIG. 2, according to a second embodiment of an electrode having a gas discharge function.

The coating film 57 may be formed throughout a side wall from a bottom of the clearance portion 56 having the concave shape as shown in FIG. 3, or may be formed only at the bottom of the clearance portion 56 having the concave shape as shown in FIG. 4.

Also, when the coating film 57 is formed by, for example, spraying, the coating film 57 may be formed inside the gas hole 54 near an outlet of the gas hole 54 communicating with the clearance portion 56, as shown in FIG. 4. The coating film 57 may be also formed inside the gas hole 54. When the coating film 57 is formed inside the gas hole 54 near the outlet, the vicinity of the outlet of the gas hole 54 may also be protected from plasma.

Third Embodiment

Figure 5:
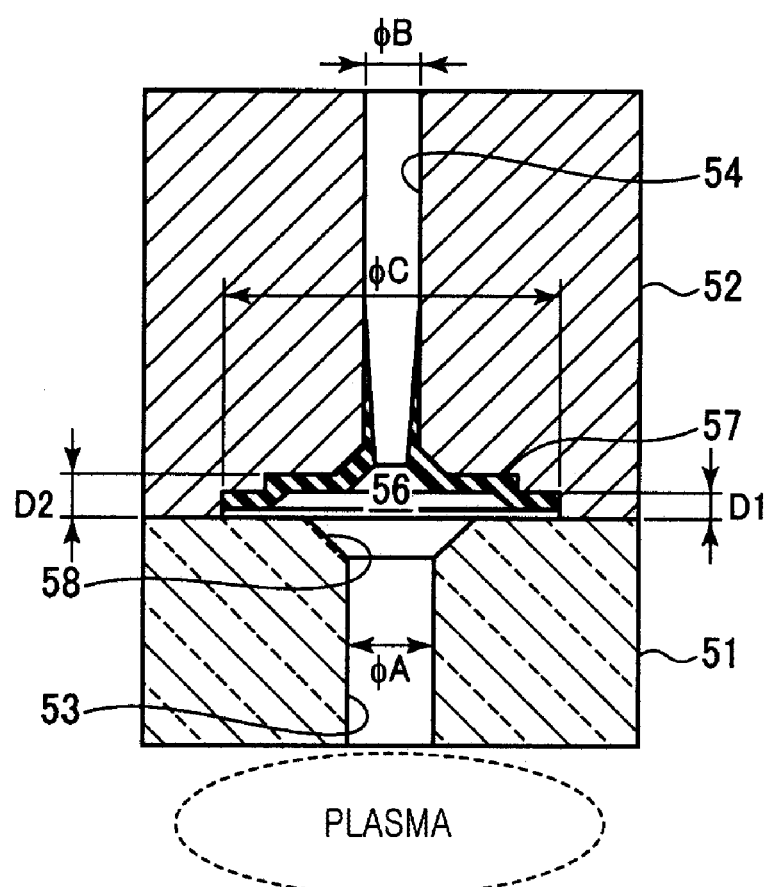
FIG. 5 is a magnified view of an example of the inside of the broken line frame III of FIG. 2, according to a third embodiment of an electrode having a gas discharge function.

FIG. 5 is a magnified view of an example of the inside of the broken line frame III of FIG. 2, according to a third embodiment of an electrode having a gas discharge function.

Alternatively, as shown in FIG. 5, a depth D1 of an outer circumference of the clearance portion 56 may be shallower than a depth D2 of an inner side of the clearance portion 56. As such, by setting the depth D1 of the outer circumference of the clearance portion 56 shallower than the depth D2 of the inner side, it may be difficult for plasma that deeply entered the inside of the clearance portion 56 to reach the side wall of the clearance portion 56. Such a benefit is specifically useful, for example, in a structure where the coating film 57 does not exist on the side wall of the clearance portion 56.

Also, as shown in FIGS. 4 and 5, a chamfered portion 58 having a tapered shape may be formed at a surface of the gas hole 53 of the electrode cover member 51 attached to the base material 52, wherein the chamfered portion 58 has a hole diameter larger than the gas hole diameter φA of the gas hole 53 of the electrode cover member 51 and smaller than a hole diameter φC of the clearance portion having the concave shape. By forming such a chamfered portion 58, the processing gas transferred through the small gas hole 54 of the base material 52 may be definitely introduced to the gas hole 53 of the electrode cover member 51, even if an adhesion location of the electrode cover member 51 to the base material 52 is misaligned, or misalignment of gas holes is generated due to a difference of thermal expansion.

Fourth Embodiment

First Example

Figure 6:
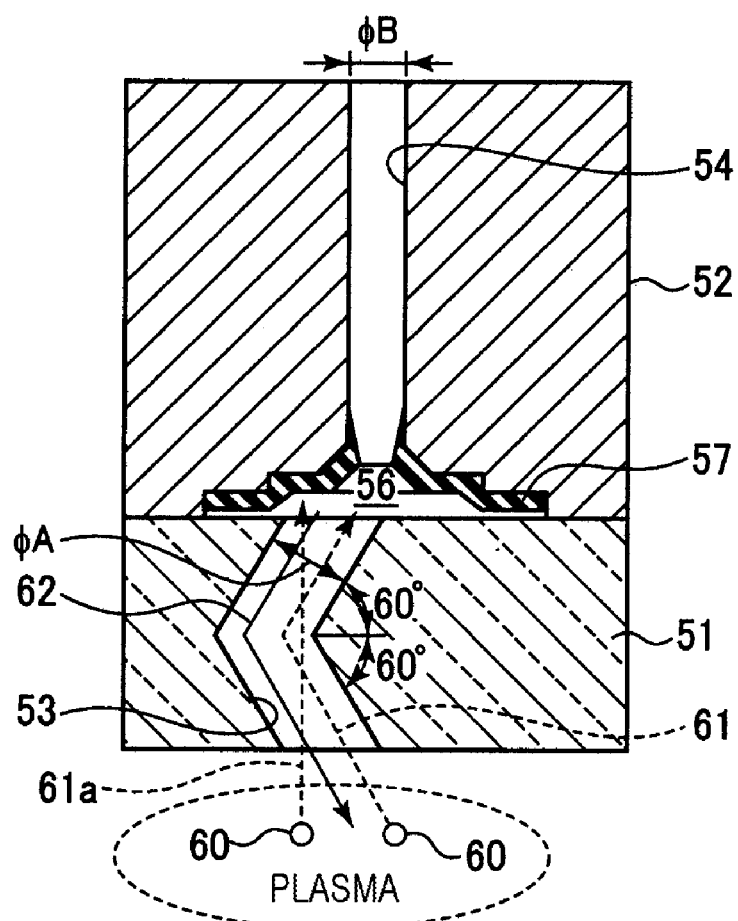
FIG. 6 is a magnified view of a first example of the inside of the broken line frame III of FIG. 2, according to a fourth embodiment of an electrode having a gas discharge function.

FIG. 6 is a magnified view of a first example of the inside of the broken line frame III of FIG. 2, according to a fourth embodiment of an electrode having a gas discharge function.

As shown in FIG. 6, a direction of the gas hole 53 of the electrode cover member 51 may be tilted in the middle of the electrode cover member 51. The gas hole 53 is tilted so that charged particles 60 flowed backward from plasma in the processing space do not directly enter the gas hole 54 of the base material 52 as indicated by an arrow 61. In the present embodiment, the gas hole 53 at the clearance portion 56 is tilted by 60° with respect to a horizontal plane, and similarly, the gas hole 53 at the processing space is tilted by 60° with respect to the horizontal plane. Accordingly, a cross-sectional shape of the gas hole 53 has a bend of 60°+60°=120° in the middle of the electrode cover member 51. Also, for example, the gas hole diameter φA of the gas hole 53 may be 1 mm, and the gas hole diameter φB of the gas hole 54 may be 0.6 mm.

As such, by tilting the gas hole 53 in the middle of the electrode cover member 51, the charged particles 60 flowed backward from the plasma do not directly enter the gas hole 54 of the base material 52, and thus it is possible to better protect the base material 52 from a shock or abnormal discharge due to the charged particles 60, for example, electrons and ions, in the plasma. Accordingly, the base material 52 or the electrode cover member 51 is not easily damaged.

Alternatively, when the gas hole 53 is straightly formed, a plane area of a region where an inside of the clearance portion 56 is directly seen from the processing space through the gas hole 53 may be the same as a plane area of the gas hole 53 itself.

Accordingly, as shown in the first example of the fourth embodiment, when the gas hole 53 is tilted in the middle of the electrode cover member 51, the plane area of the region where the inside of the clearance portion 56 is directly seen from the processing space through the gas hole 53 may be smaller than an area of the gas hole 53 itself, or the region may not be shown at all.

As such, by tilting the gas hole 53 in the middle of the electrode cover member 51, the plane area of the region where the inside of the clearance portion 56 is seen from the processing space may be smaller than that when the gas hole 53 is straightly formed, or may not be shown. In this case as well, an amount of the charged particles 60 in the plasma reaching the clearance portion 56 through the gas hole 53 may be reduced compared to that when the gas hole 53 is straightly formed. As a result, in the first example, the base material 52 may be better protected from a shock or abnormal discharge due to the charged particles 60, for example, electrons and ions, in the plasma.

Also, in the first example of the fourth embodiment, the tilted gas hole 53 of the electrode cover member 51 is misaligned from the gas hole 54 of the base material 52 so that the gas hole 54 of the base material 52 is not directly seen from the processing space. In this case, even if the charged particles 60 proceeded into the inside of the gas hole 53 in a straight line, the charged particles 60 do not directly enter the gas hole 54 of the base material 52 as indicated by an arrow 61a of FIG. 6. Accordingly, the base material 52 may be better protected from a shock or abnormal discharge due to the charged particles 60, for example, electrons and ions.

Also, in the present example, since the gas hole 53 at the processing space is tilted by 60°, a direction of a gas discharged from the gas hole 53 is tilted by 120° with respect to a surface of the electrode cover member 51 at the processing space, as indicated by an arrow 62.

Second Example

Figure 7:
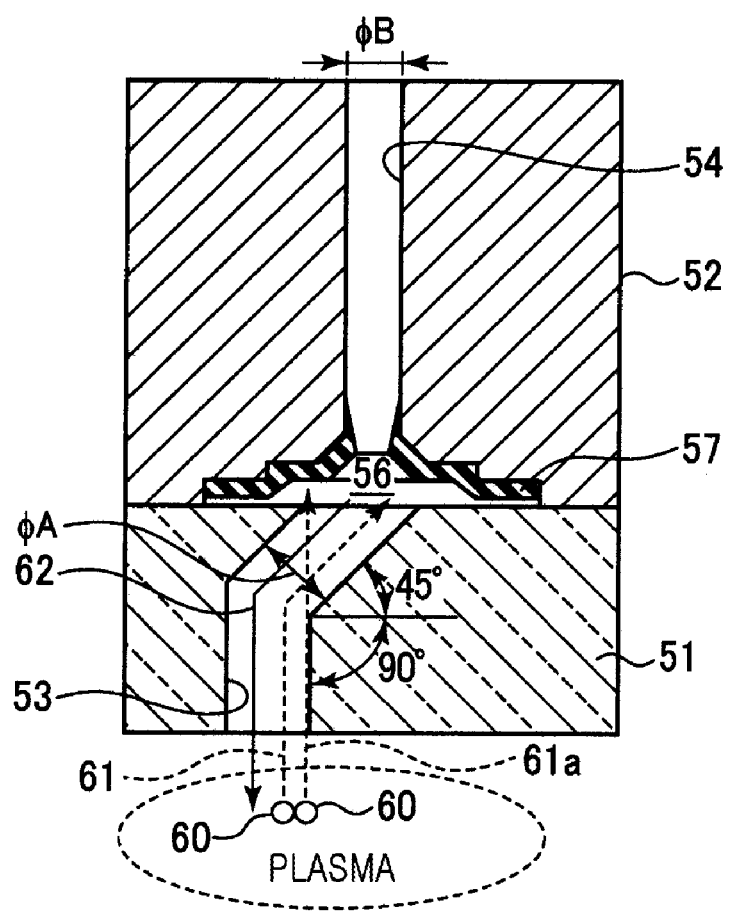
FIG. 7 is a magnified view of a second example of the inside of the broken line frame III of FIG. 2, according to the fourth embodiment of the electrode having a gas discharge function.

FIG. 7 is a magnified view of a second example of the inside of the broken line frame III of FIG. 2, according to the fourth embodiment of the electrode having a gas discharge function.

In the first example of the fourth embodiment, the gas hole 53 at the clearance portion 56 is tilted by 60° with respect to the horizontal plane, but a tilting angle of the gas hole 53 is not limited to 60°. For example, as shown in FIG. 7, the gas hole 53 at the clearance portion 56 may be tilted by 45° with respect to the horizontal plane. In other words, the tilting angle may be an angle that prevents the charged particles 60 from directly entering the gas hole 54 of the base material 52.

Also, the gas hole 53 at the processing space may be tilted by 90° with respect to the horizontal plane, i.e., perpendicular to the processing space. Accordingly, a cross-sectional shape of the gas hole 53 of the present example has a bend of 45°+90°=135° in the middle. Also, the gas hole diameter φA of the gas hole 53 may be 1 mm, like the first example, and the gas hole diameter φB of the gas hole 54 may be 0.6 mm, like the first example.

Also in the second example of the fourth embodiment, the direction of the gas hole 53 is tilted in the middle of the electrode cover member 51, and thus, like the first example, the base material 52 may be better protected from a shock or abnormal discharge due to the charged particles 60, for example, electrons and ions, in the plasma.

Also, as in the second example of the fourth embodiment, the gas hole 53 at the processing space may be tilted by 90° with respect to the horizontal plane, i.e., perpendicular to the processing space. When the gas hole 53 at the processing space is perpendicular to the processing space, the direction of the gas discharged from the gas hole 53 may be perpendicular to the surface of the electrode cover member 51 at the processing space, as indicated by the arrow 62.

Also, as in the second example of the fourth embodiment, the gas hole 53 is tilted in the middle of the electrode cover member 51. Accordingly, the plane area of the region where the inside of the clearance portion 56 is directly seen from the processing space may be smaller than that when the gas hole 53 is straightly formed, or may not be seen.

Accordingly, like the first example of the fourth embodiment, in the second example, the amount of the charged particles 60 in the plasma reaching the clearance portion 56 through the gas hole 53 may be reduced compared to that when the gas hole 53 is straightly formed, and thus the base material 52 may be better protected from a shock or abnormal discharge due to the charged particles 60, for example, electrons and ions, in the plasma.

Also, like the first example of the fourth embodiment, in the second example, the tilted gas hole 53 of the electrode cover member 51 is misaligned from the gas hole 54 of the base material 52. Accordingly, like the first example, even if the charged particles 60 proceeded into the inside of the gas hole 53 in a straight line, the charged particles 60 do not directly enter the gas hole 54 of the base material 52, as indicated by the arrow 61a of FIG. 7. Consequently, the base material 52 may be better protected from a shock or abnormal discharge due to the charged particles 60, for example, electrons and ions.

Third Example

Figure 8:
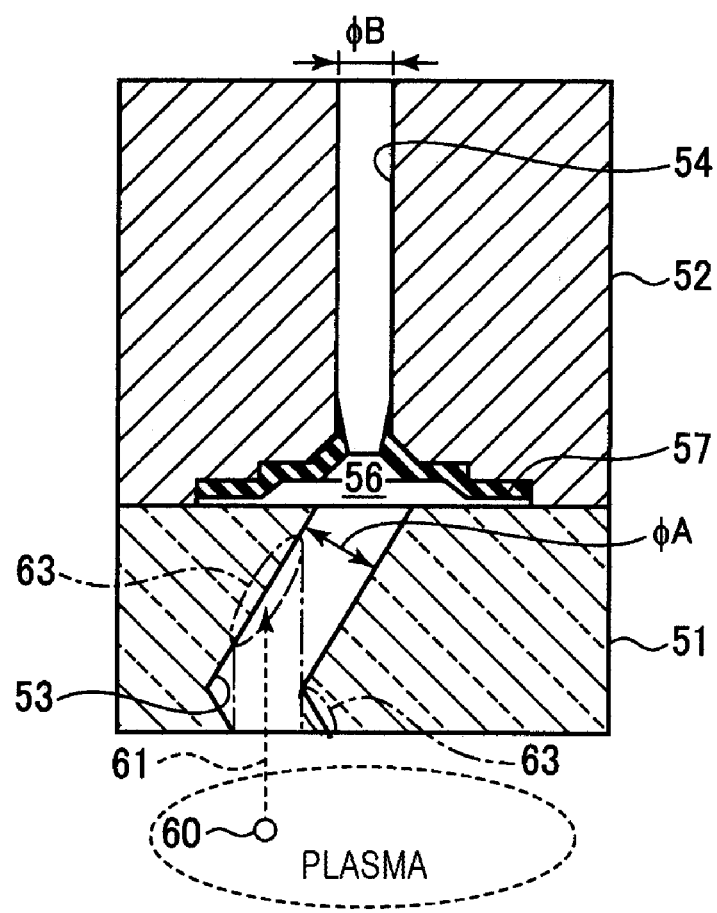
FIG. 8 is a magnified view of a third example of the inside of the broken line frame III of FIG. 2, according to the fourth embodiment of the electrode having a gas discharge function.

FIG. 8 is a magnified view of a third example of the inside of the broken line frame III of FIG. 2, according to the fourth embodiment of the electrode having a gas discharge function.

When the gas hole 53 of the electrode cover member 51 has, for example, a straight line shape, the gas hole 54 of the base material 52 may be directly shown through the gas hole 53 from the gas hole 53 at the processing space. When the gas hole 54 is directly seen from the processing space, it is highly likely for the charged particles 60 to directly enter the inside of the gas hole 54.

Accordingly, in the third example shown in FIG. 8, like the first and second examples of the fourth embodiment, the gas hole 53 is tilted in the middle of the electrode cover member 51. Also, in the third example, a side surface 63 of the tilted gas hole 53 is used so that the gas hole 54 of the base material 52 is hidden and not seen from the processing space. As such, since the side surface 63 of the tilted gas hole 53 hides the gas hole 54 of the base material 52 to prevent the gas hole 54 from being directly seen from the processing space, a backflow path wherein the charged particles 60 directly enter the gas hole 54 may be definitely blocked by the side surface 63 of the gas hole 53.

According to the third example of the fourth embodiment, since the gas hole 54 of the base material 52 is hidden and not directly seen from the processing space by using the side surface 63 of the tilted gas hole 53, the charged particles 60 are definitely prevented from directly entering the gas hole 54 of the base material 52, compared to when the gas hole 54 is not hidden.

Fourth Example

Figure 9:
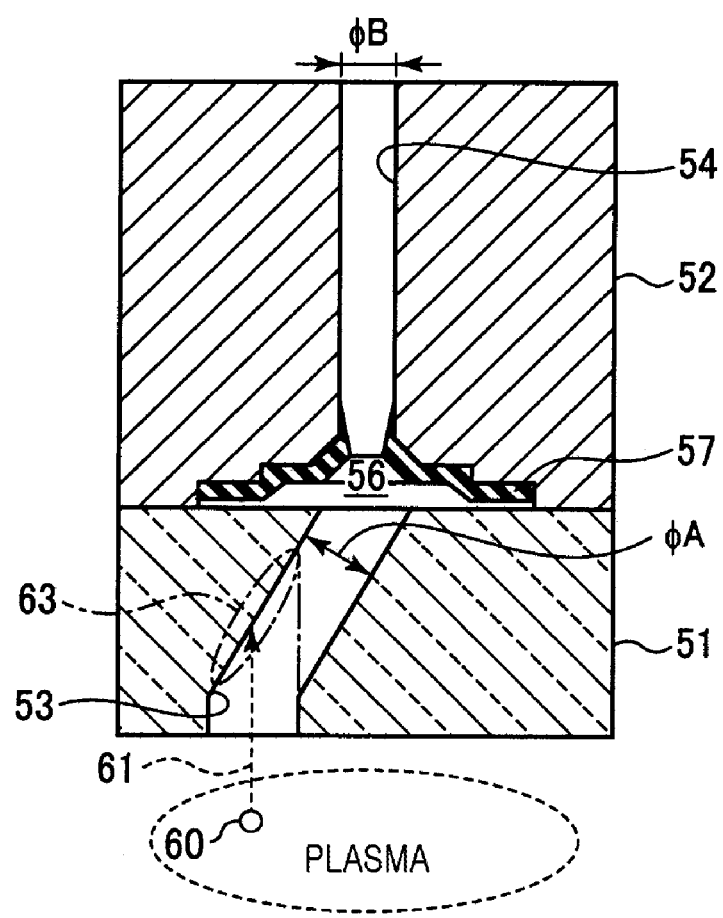
FIG. 9 is a magnified view of a fourth example of the inside of the broken line frame III of FIG. 2, according to the fourth embodiment of the electrode having a gas discharge function.

FIG. 9 is a magnified view of a fourth example of the inside of the broken line frame III of FIG. 2, according to the fourth embodiment of the electrode having a gas discharge function.

As shown in FIG. 9, the fourth example of the fourth embodiment, like the third example of the fourth embodiment, the gas hole 54 of the base material 52 is hidden and not directly seen from the processing space by using the side surface 63 of the tilted gas hole 53. A difference is that in the third example, the gas hole 53 at the base material 52 and the gas hole 53 at the processing space are both tilted by an angle other than 90° with respect to the horizontal plane, whereas in the fourth example, like the second example, the gas hole 53 at the processing space is tilted by 90° to the horizontal plane, i.e., perpendicular to the processing space.

Like the fourth example of the fourth embodiment, the second and third examples of the fourth embodiment may be combined.

Fifth Embodiment

First Example

Figure 10A:
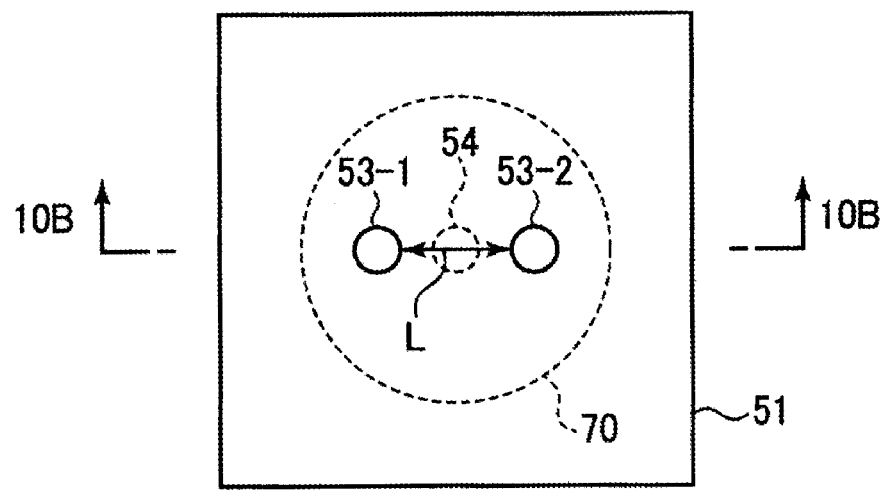
FIG. 10A is a magnified plan view of a first example of the inside of the broken line frame III of FIG. 2, according to a fifth embodiment of an electrode having a gas discharge function, viewed from a processing space.
Figure 10B:
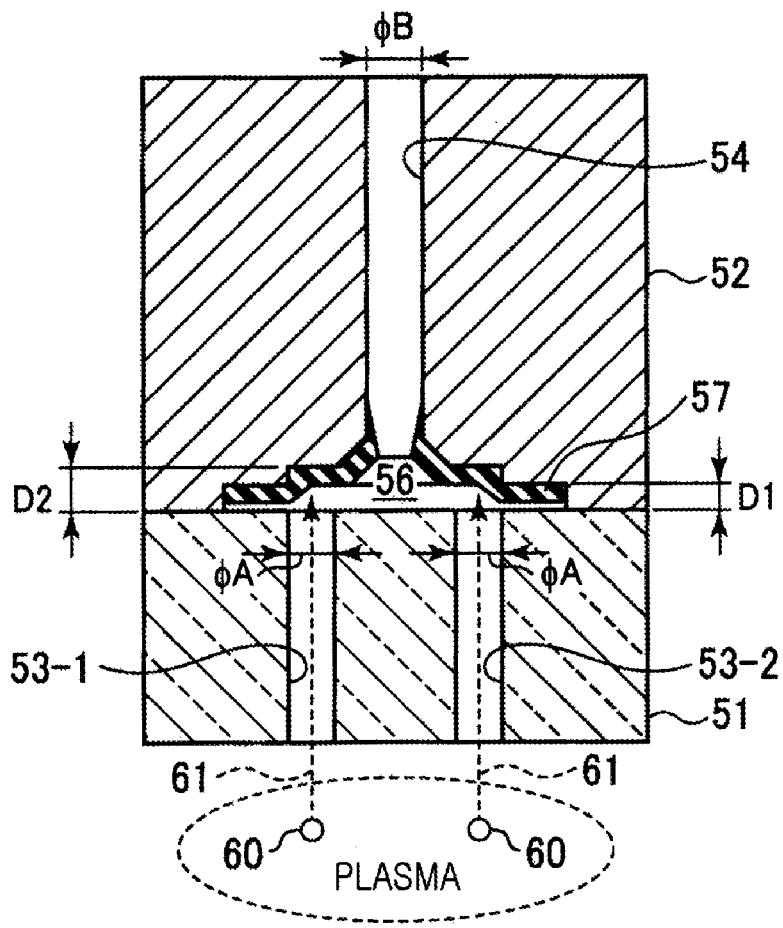
FIG. 10B is a cross-sectional view taken along a line 10B-10B of FIG. 10A.

FIG. 10A is a magnified plan view of a first example of the inside of the broken line frame III of FIG. 2, according to a fifth embodiment of an electrode having a gas discharge function, viewed from a processing space, and FIG. 10B is a cross-sectional view taken along a line 10B-10B of FIG. 10A.

In the first through fourth embodiments, the gas holes 54 of the base material 52 and the gas holes 53 of the electrode cover member 51 correspond to each other in a one-to-one manner.

However, it is possible to match a plurality of gas holes 53 of the electrode cover member 51 to one gas hole 54 of the base material 52, i.e., match the gas holes 53 and the gas holes 54 in a many-to-one manner.

According to the first example of the fifth embodiment shown in FIGS. 10A and 10B, the electrode cover member 51 includes a gas hole group 70 including two gas holes 53-1 and 53-2 corresponding to one gas hole 54 of the base material 52. The electrode cover member 51 includes a plurality of such gas hole groups 70.

Also, in the first example of the fifth embodiment, the gas holes 53-1 and 53-2 included in the gas hole group 70 are misaligned from the gas hole 54 so as not to overlap the gas hole 54 of the base material 52. In the present example, the gas holes 53-1 and 53-2 are aligned with each other, and the gas hole 54 of the base material 52 is disposed between the gas holes 53-1 and 53-2, for example, in the middle of the gas holes 53-1 and 53-2. A distance L from an outer circumference of the gas hole 53-1 to an outer circumference of the gas hole 53-2 may be 1.5 mm. Also, the gas hole diameter $\phi A$ of each of the gas holes 53-1 and 53-2 may be 0.5 mm, and the gas hole diameter $\phi B$ of the gas hole 54 may be 0.6 mm.

In the first example of the fifth embodiment, first, the plurality of gas holes 53, in the present example, two gas holes 53-1 and 53-2, are matched to one gas hole 54. In this structure, conductance of the gas hole group 70 of the electrode cover member 51 is a sum of conductance of the gas holes 53-1 and 53-2. Accordingly, the gas hole diameter $\phi A$ of each of the gas holes 53-1 and 53-2 may not be larger than the gas hole diameter $\phi B$ of the gas hole 54 in order for the conductance of the gas hole group 70 to be higher than conductance of the gas hole 54 of the base material 52. In other words, the gas hole diameter φA of each of the gas holes 53-1 and 53-2 may be smaller than or equal to the gas hole diameter φB of the gas hole 54.

As such, when a relationship between the gas hole diameter φA and the gas hole diameter φB is φA≤φB, for example, composite conductance obtained by adding the conductances of each of the gas holes 53-1 and 53-2 included in the gas hole group 70 of the electrode cover member 51 may be set to be higher than the conductance of the gas hole 54 of the base material 52 corresponding to the gas hole group 70. Accordingly, like the first example, the electrode cover member 51 may not receive a differential pressure (stress) by a processing gas during a gas discharge.

Also, when the gas hole diameter φA of the gas holes 53 is smaller than or equal to the gas hole diameter φB of the gas hole 54, it may be difficult for the charged particles 60 from the plasma in the processing space to enter the gas holes 53 of the electrode cover member 51, or the charged particles 60 may not enter the gas holes 53 at all, compared to when the gas hole diameter φA is larger than the gas hole diameter φB. When the charged particles 60 barely enter or do not enter the gas holes 53 of the electrode cover member 51, an effect of suppressing a damage of the base material 52 caused by the charged particles 60 flowed backward from the plasma or an abnormal discharge of the base material 52, for example, inside the gas hole 54, may be further increased.

A detailed diameter of the gas hole diameter φA of the gas holes 53 may be from 0.1 mm to 1.0 mm, preferably from 0.1 mm to 0.6 mm, and more preferably from 0.3 mm to 0.6 mm.

Also, a detailed diameter of the gas hole diameter φB of the gas hole 54 may be from 0.5 mm to 1.0 mm.

It is preferable to set the gas hole diameter φA and the gas hole diameter φB within the above ranges, and the gas hole diameter φA to be smaller than or equal to the gas hole diameter φB in terms of practicality.

Also, in the first example of the fifth embodiment, the gas holes 53-1 and 53-2 are misaligned from the gas hole 54. Accordingly, the gas hole 54 of the base material 52 is not directly seen from the gas holes 53 of the electrode cover member 51 at the processing space (refer to FIG. 10A). Accordingly, in the first example of the fifth embodiment, the charged particles 60 flowed backward from the plasma may not directly enter the gas hole 54 of the base material 52.

Accordingly, in the first example of the fifth embodiment, it is possible to protect the base material 52 from a shock due to the charged particles 60, for example, electrons and ions, in the plasma, or an abnormal discharge generated in the base material 52, for example, the gas hole 54. Thus, it is difficult for the base material 52 to be damaged.

Second Example

Figure 11:
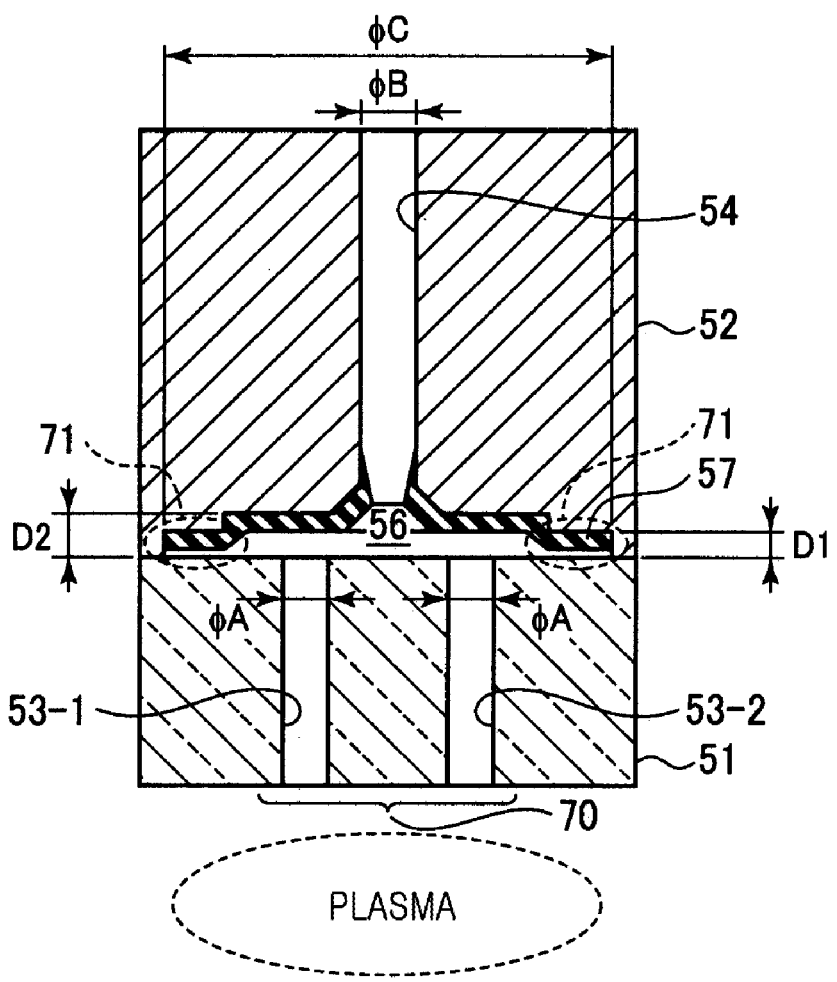
FIG. 11 is a magnified view of a second example of the inside of the broken line frame III of FIG. 2, according to the fifth embodiment of the electrode having a gas discharge function.

FIG. 11 is a magnified view of a second example of the inside of the broken line frame III of FIG. 2, according to the fifth embodiment of the electrode having a gas discharge function.

When the plurality of gas holes 53-1 and 53-2 are matched to the one gas hole 54, like the first example of the fifth embodiment, the gas holes 53-1 and 53-2 may overlap each other at a portion (portion having the depth D1) where a depth formed at the outer circumference of the clearance portion 56 is shallow, as shown in FIG. 10B. It does not matter whether the gas holes 53-1 and 53-2 overlap each other at a portion having a shallow depth, but compared to when the gas holes 53-1 and 53-2 do not overlap each other at the portion having the shallow depth, the plasma easily reaches a side wall of the clearance portion 56.

To solve this problem, as shown in FIG. 11, for example, a hole diameter φC of the clearance portion 56 may be increased such that a portion 71 having a shallow depth is formed outside the gas hole group 70 including the gas holes 53-1 and 53-2.

Third Example

Figure 12A:
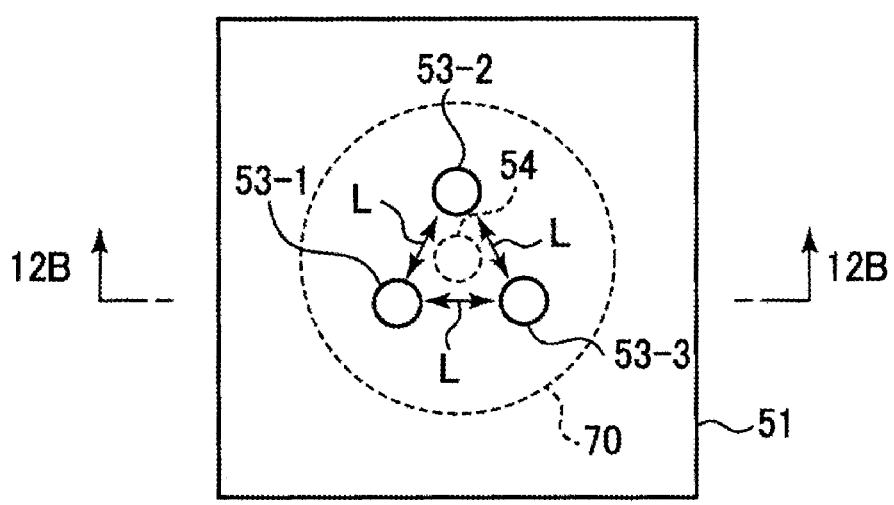
FIG. 12A is a magnified plan view of a third example of the inside of the broken line frame III of FIG. 2, according to the fifth embodiment of the electrode having a gas discharge function, viewed from the processing space.
Figure 12B:
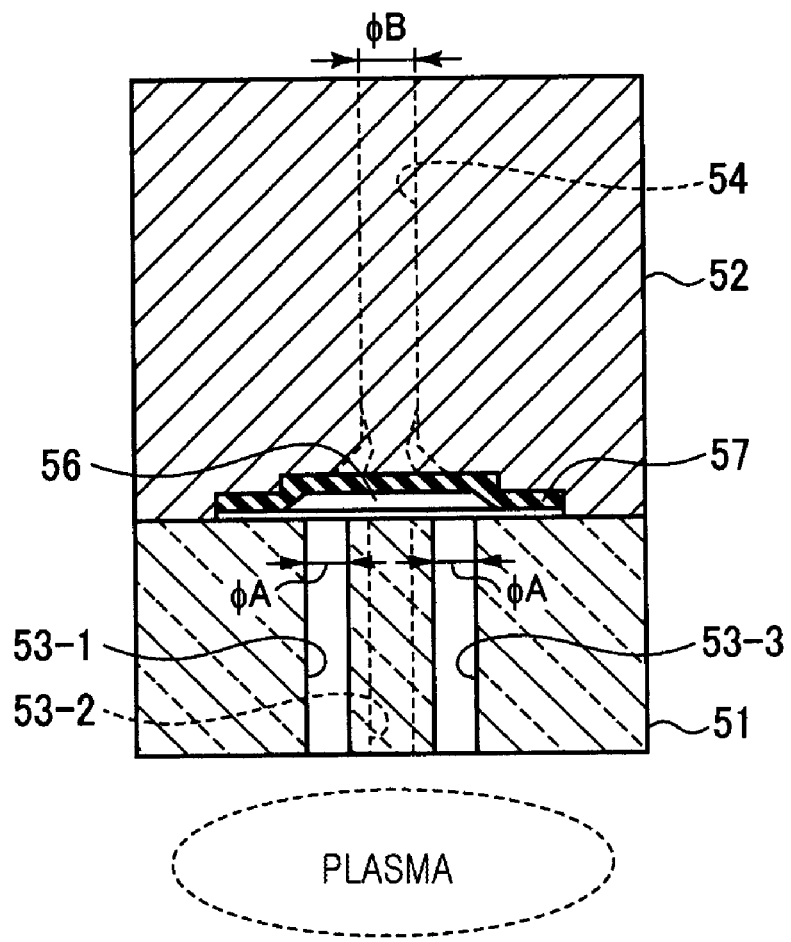
FIG. 12B is a cross-sectional view taken along a line 12B-12B of FIG. 12A.

FIG. 12A is a magnified plan view of a third example of the inside of the broken line frame III of FIG. 2, according to the fifth embodiment of the electrode having a gas discharge function, viewed from the processing space, and FIG. 12B is a cross-sectional view taken along a line 12B-12B of FIG. 12A.

As shown in FIGS. 12A and 12B, three gas holes 53-1 through 53-3 are included in the gas hole group 70 in the third example of the fifth embodiment. In the present example, the three gas holes 53-1 through 53-3 may be disposed respectively at, for example, three vertexes of an equilateral triangle, and the gas hole 54 of the base material 52 may be disposed at a center of gravity of the equilateral triangle. A distance L between outer circumferences of the gas holes 53-1 through 53-3 may be 1.0 mm. The gas hole diameter φA of each of the gas holes 53-1 through 53-3 may be 0.5 mm, and the gas hole diameter φB of the gas hole 54 may be 0.6 mm.

Even in the third example of the fifth embodiment, since each of the gas holes 53-1 through 53-3 is misaligned from the gas hole 54, and the gas hole diameter φA of the gas holes 53 is smaller than or equal to the gas hole diameter φB of the gas hole 54, the same effects as the first example of the fifth embodiment may be obtained.

Fourth Example

Figure 13A:
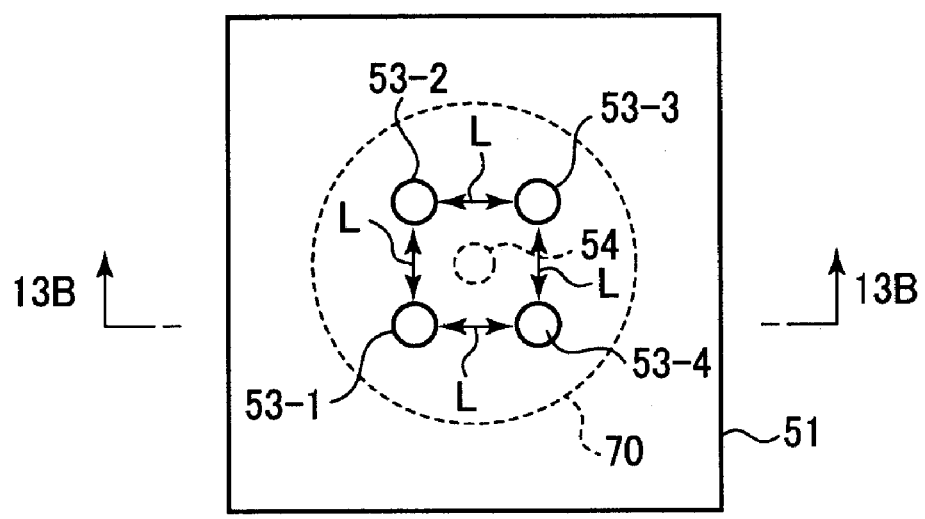
FIG. 13A is a magnified plan view of a fourth example of the inside of the broken line frame III of FIG. 2, according to the fifth embodiment of the electrode having a gas discharge function, viewed from the processing space.
Figure 13B:
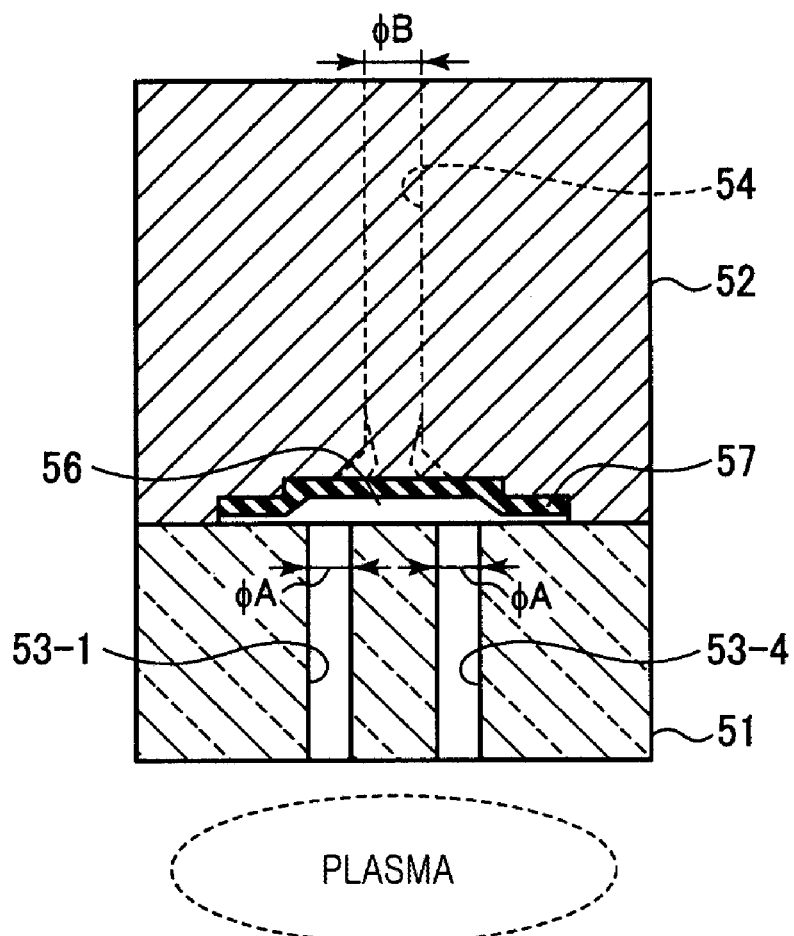
FIG. 13B is a cross-sectional view taken along a line 13B-13B of FIG. 13A.

FIG. 13A is a magnified plan view of a fourth example of the inside of the broken line frame III of FIG. 2, according to the fifth embodiment of the electrode having a gas discharge function, viewed from the processing space, and FIG. 13B is a cross-sectional view taken along a line 13B-13B of FIG. 13A.

As shown in FIGS. 13A and 13B, four gas holes 53-1 through 53-4 are included in the gas hole group 70 in the fourth example of the fifth embodiment. In the present example, the four gas holes 53-1 through 53-4 are respectively arranged, for example, at four vertexes of a square, and the gas hole 54 of the base material 52 is disposed at a center of gravity of the square. A distance L between the gas holes 53-1 through 54-4 may be 1.0 mm. The gas hole diameter φA of each of the gas holes 53-1 through 53-4 may be 0.5 mm, and the gas hole diameter φB of the gas hole 54 may be 0.6 mm.

In the fourth example of the fifth embodiment, since each of the gas holes 53-1 through 53-4 is misaligned from the gas hole 54, and the gas hole diameter φA of the gas holes 53 is smaller than or equal to the gas hole diameter φB of the gas hole 54, the same effects as the first example of the fifth embodiment may be obtained.

Fifth Example

Figure 14:
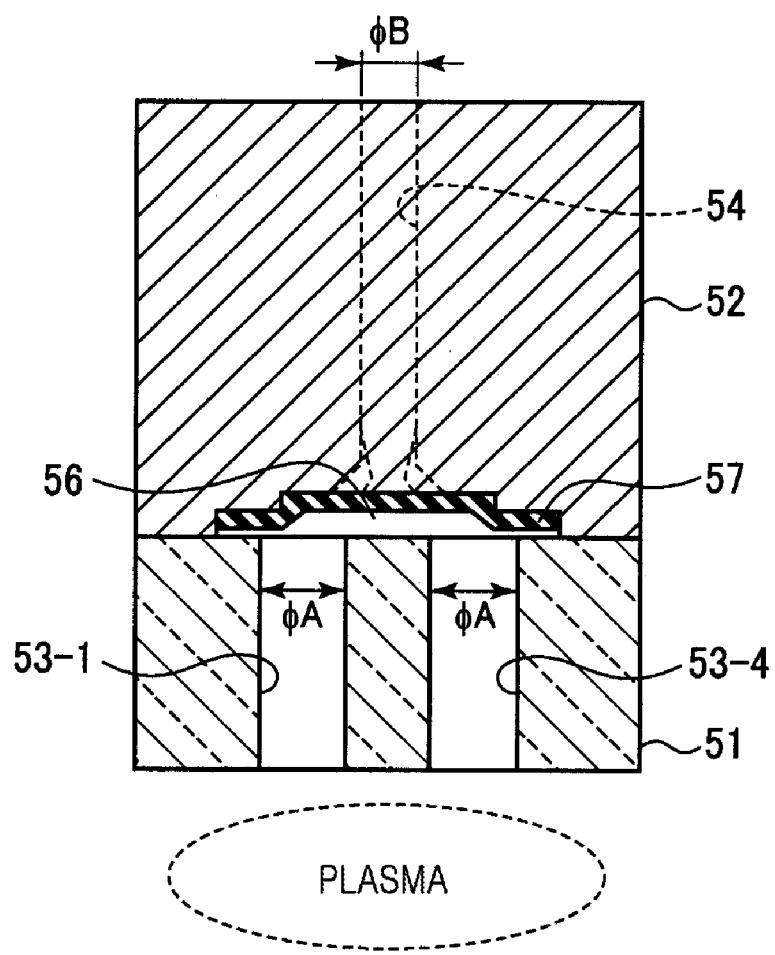
FIG. 14 is a magnified view of a fifth example of the inside of the broken line frame III of FIG. 2, according to the fifth embodiment of the electrode having a gas discharge function.

FIG. 14 is a magnified view of a fifth example of the inside of the broken line frame III of FIG. 2, according to the fifth embodiment of the electrode having a gas discharge function.

In the first through fourth examples of the fifth embodiment, the gas hole diameter φA is smaller than or equal to the gas hole diameter φB, but of course, as shown in FIG. 14, the gas hole diameter φA may be larger than the gas hole diameter φB. FIG. 14 illustrates an example where the gas hole diameter φA is larger than the gas hole diameter φB, in the fourth example of the fifth embodiment.

A condition described with reference to the first embodiment may be employed to determine how much larger the gas hole diameter φA may be than the gas hole diameter φB. In other words, a size of the gas hole diameter φA may be from 1 mm to 2 mm, and the gas hole diameter φA may be larger than one time and smaller than or equal to about 3 times the gas hole diameter φB. More preferably, the gas hole diameter φA may be from 1.5 times to 3 times the gas hole diameter φB.

Sixth Example

Figure 15:
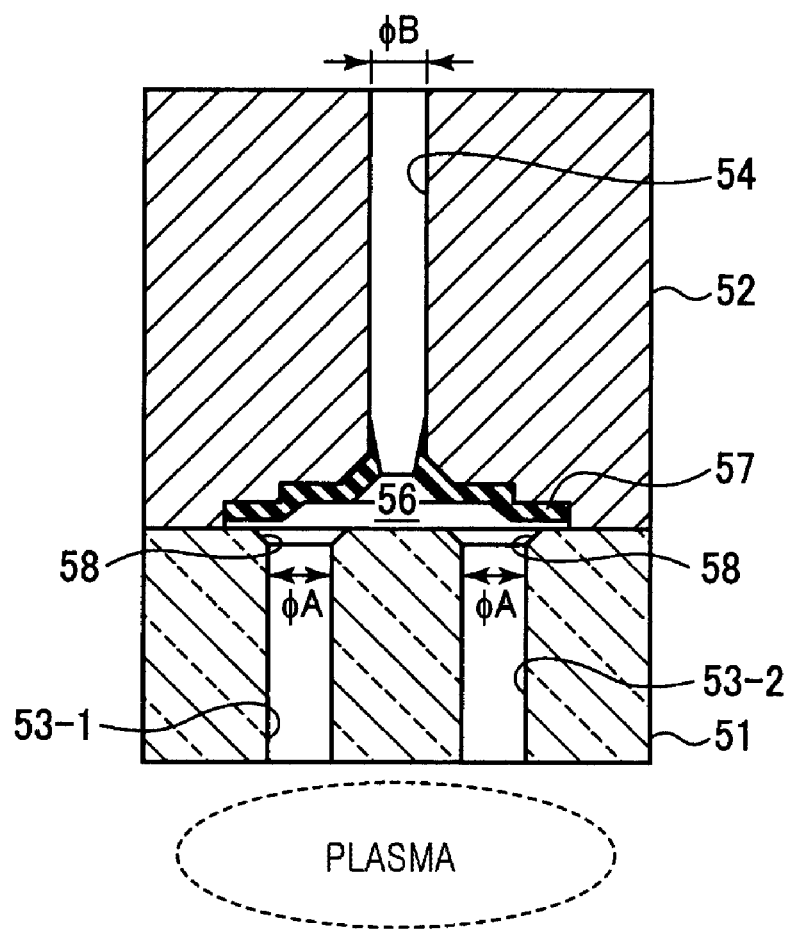
FIG. 15 is a magnified view of a sixth example of the inside of the broken line frame III of FIG. 2, according to the fifth embodiment of the electrode having a gas discharge function.

FIG. 15 is a magnified view of a sixth example of the inside of the broken line frame III of FIG. 2, according to the fifth embodiment of the electrode having a gas discharge function.

In the fifth embodiment described with reference to FIGS. 10A through 14, the chamfered portion 58 described with reference to the third embodiment may be formed as shown in FIG. 15. FIG. 15 illustrates an example of forming the chamfered portion 58 with respect to the first example of the fifth embodiment.

In the sixth example of the fifth embodiment, further to the same effects as the first through fifth examples of the fifth embodiment, the base material 52 may definitely introduce a processing gas received through the small gas hole 54 to the gas holes 53 of the electrode cover member 51, even when the attached location of the electrode cover member 51 to the base material 52 is misaligned, or a gas hole is misaligned due to a difference of thermal expansion.

Seventh Example

Figure 16:
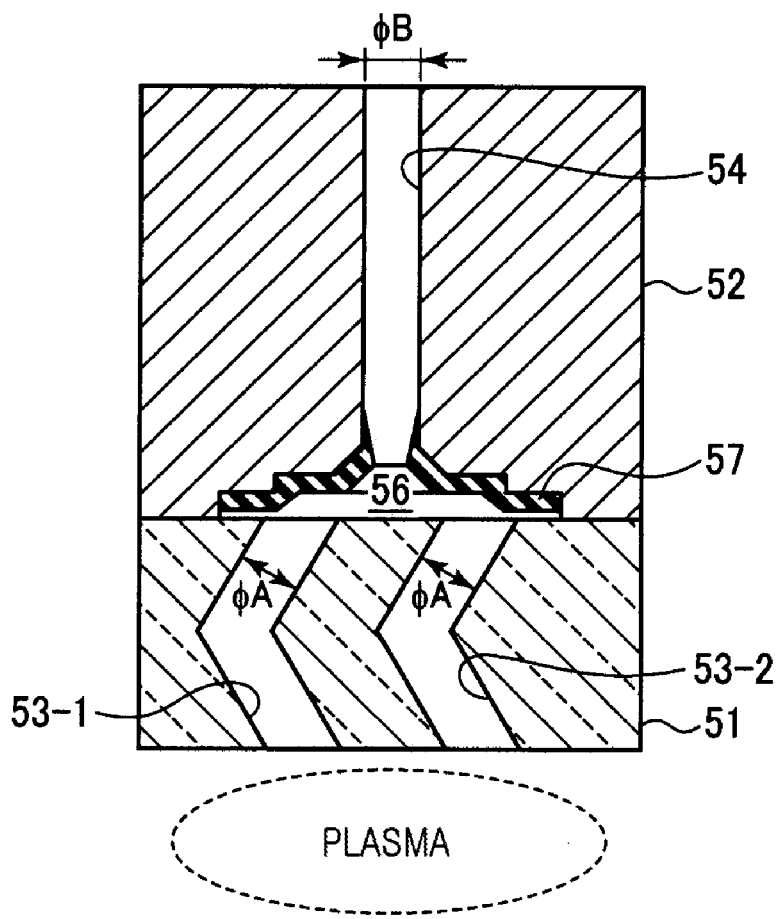
FIG. 16 is a magnified view of a seventh example of the inside of the broken line frame III of FIG. 2, according to the fifth embodiment of the electrode having a gas discharge function.

FIG. 16 is a magnified view of a seventh example of the inside of the broken line frame III of FIG. 2, according to the fifth embodiment of the electrode having a gas discharge function.

In the fifth embodiment described with reference to FIGS. 10A through 15, it is possible to tilt the plurality of gas holes 53-1 and 53-2 in the middle of the electrode cover member 51 as described in the fourth embodiment, as shown in FIG. 16. FIG. 16 illustrates an example of tilting the gas holes 53-1 and 53-2 in the middle of the electrode cover member 51 with respect to the first example of the fifth embodiment.

In the seventh example of the fifth embodiment, further to the same effects as the first through sixth examples of the fifth embodiment, since the gas holes 53-1 and 53-2 are tilted in the middle of the electrode cover member 51, the charged particles 60 flowed backward from the plasma do not directly enter the gas hole 54 of the base material 52.

Sixth Embodiment

Figure 17:
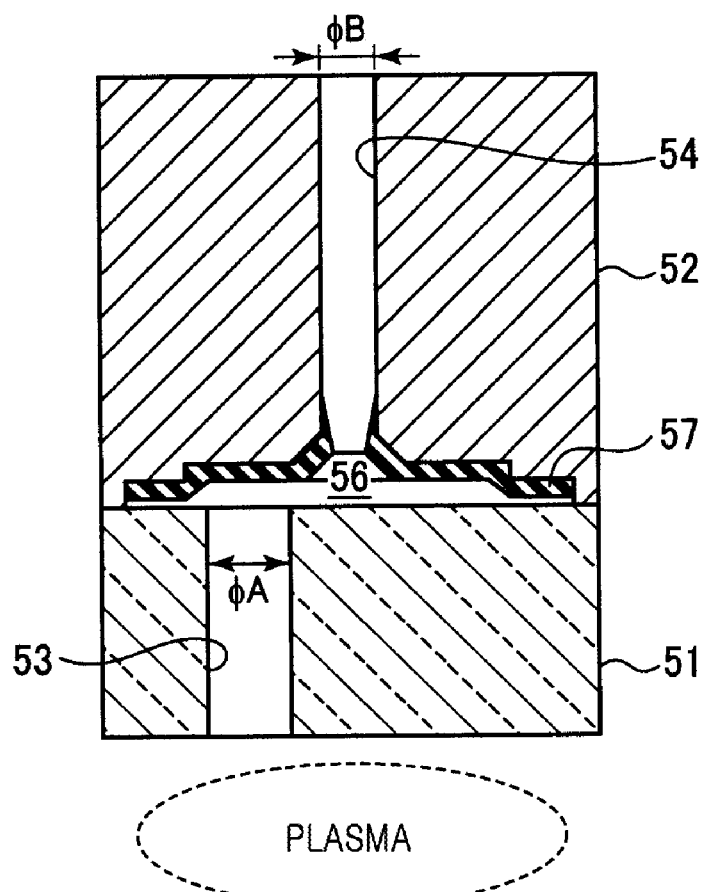
FIG. 17 is a magnified view of an example of the inside of the broken line frame III of FIG. 2, according to a sixth embodiment of an electrode having a gas discharge function.

FIG. 17 is a magnified view of an example of the inside of the broken line frame III of FIG. 2, according to a sixth embodiment of an electrode having a gas discharge function.

In the fifth embodiment, it has been described that the charged particles 60 flowed backward from the plasma do not directly enter the gas hole 54 of the base material 52 when the gas hole 53 of the electrode cover member 51 and the gas hole 54 of the base material 52 are misaligned such that the gas holes 53 and 54 do not overlap each other.

Such a point of view may also be applied when the gas hole 54 of the base material 52 and the gas hole 53 of the electrode cover member 51 are matched in a one-to-one manner. In the sixth embodiment shown in FIG. 17, the gas hole 53 of the electrode cover member 51 and the gas hole 54 of the base material 52 are misaligned such that the gas holes 53 and 54 do not overlap each other. Accordingly, the charged particles flowed backward from the plasma may not directly enter the gas hole 54 of the base material 52.

Seventh Embodiment

Figure 18:
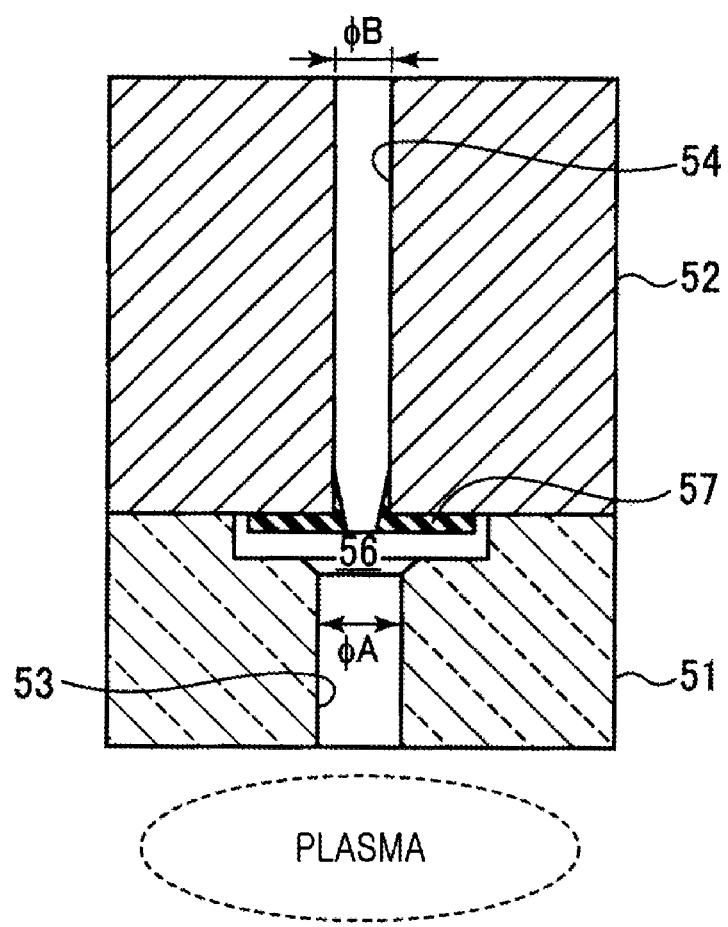
FIG. 18 is a magnified view of an example of the inside of the broken line frame III of FIG. 2, according to a seventh embodiment of an electrode having a gas discharge function.

FIG. 18 is a magnified view of an example of the inside of the broken line frame III of FIG. 2, according to a seventh embodiment of an electrode having a gas discharge function.

In the first through sixth embodiments, the clearance portion 56 having the concave shape is formed on the surface of the base material 52 attached to the electrode cover member 51. However, as shown in FIG. 18, the clearance portion 56 having the concave shape may be formed on the surface of the electrode cover member 51 attached to the base material 52. In this case, the coating film 57 formed via the abrasion tolerant coating process is formed at, for example, a portion of the base material 52 exposed to the clearance portion 56. FIG. 18 illustrates an example of forming the clearance portion 56 of the second embodiment at the electrode cover member 51 instead of the base material 52. Although not specifically shown, the seventh embodiment may be applied to all examples of the first through sixth embodiments.

As such, the same effects described with reference to the first through sixth embodiments may be obtained in the seventh embodiment where the clearance portion 56 is formed at the electrode cover member 51.

Also, it is possible to form the clearance portion 56 on both of the surface of the base material 52 attached to the electrode cover member 51 and the surface of the electrode cover member 51 attached to the base material 52. In this case, like the first through sixth embodiments, the coating film 57 may be formed on the surface of clearance portion 56 of the base material 52 attached to the electrode cover member 51.

As described above, according to the first through third embodiments of the present invention, by setting the gas hole diameter φA of the gas hole 53 of the electrode cover member 51 to be larger than the gas hole diameter φB of the gas hole 54 of the base material 52, the degree of freedom related to a maximum gas flow rate may be abundant, the electrode cover member 51 may be thinned, and an electrode having a gas discharge function, in the present embodiment, the shower head 5, where it is difficult for a gas behavior to change as time passes in the processing chamber 2 during gas introduction, may be provided. Also, a plasma processing apparatus including such an electrode having the gas discharge function may be provided.

In addition, specifically according to the fourth embodiment of the present invention, the gas hole 53 may be tilted in the middle of the electrode cover member 51 so that the charged particles 60 flowed backward from the plasma do not directly enter the gas hole 54 of the base material 52. Accordingly, it is possible to satisfactorily protect the base material 52 from a shock or abnormal discharge due to the charged particles 60, for example, electrons and ions, in the plasma, and thus it is further difficult to damage the base material 52 or the electrode cover member 51.

Also, specifically according to the fifth embodiment, by matching the plurality of gas holes 53, in the present example, two gas holes 53-1 and 53-2, to one gas hole 54, the gas hole diameter φA of each of the gas holes 53-1 and 53-2 may be smaller than or equal to the gas hole diameter φB of the gas hole 54 while setting the composite conductance of the plurality of gas holes 53 to be higher than the conductance of the gas hole 54. As such, by setting the gas hole diameter φA of each of the gas holes 53-1 and 53-2 to be smaller than or equal to the gas hole diameter φB of the gas hole 54, the charged particles 60 in the plasma may be suppressed from directly entering the gas hole 54. Accordingly, it is possible to better protect the base material 52 from a shock or abnormal discharge of the charged particles 60, for example, electrons and ions, in the plasma, and thus it is further difficult to damage the base material 52 or the electrode cover member 51.

The electrode having the gas discharge function, and the plasma processing apparatus including the electrode having the gas discharge function are advantageous when a gas in the processing chamber 2 needs to be rapidly replaced by introducing a large amount of purge gas into the processing chamber 2 so as to improve throughput during a purge process.

Also, the electrode having the gas discharge function, and the plasma processing apparatus including the electrode having the gas discharge function are specifically advantageous when a non plasma particle cleaning (NPPC) process, i.e., one of cleaning techniques of a processing apparatus, using an impact force generated by rapidly introducing a cleaning gas from the electrode, in the present embodiment, the shower head 5, having the gas discharge function, into the processing chamber 2, is performed on the plasma processing apparatus.

As such, in the purge process performed during a process, since the large amount of purge gas may be introduced into the processing chamber 2 from the electrode having the gas discharge function, process time reduction may be promoted, thereby improving throughput.

Also, when the plasma processing apparatus is cleaned, it is possible to apply a sequence of the NPPC process using a gas impact force generated by introducing a large amount of gas into the processing chamber 2 while suppressing a damage of the electrode cover member 51. In other words, it is difficult to break the electrode cover member 51 even when a large amount of gas is discharged from the gas hole 53 of the electrode cover member 51.

An example of process conditions of the NPPC process is as follows.

Cleaning Gas: $N_2$ (Inert Gas)
Flow Rate of Cleaning Gas: 2000 sccm to 10000 sccm
Cleaning Time: 1 sec to 10 min (Preferably 1 sec to 3 min)
Cleaning Temperature Room Temperature to 300° C. (Room temperature is 25° C.)
State of Processing Space: Non-Plasma State As such, in the NPPC process, specifically, the cleaning gas is rapidly introduced into the processing chamber 2 at once at a large flow rate of 2000 sccm to 10000 sccm. The electrode having the gas discharge function according to the above embodiment is specifically advantageous when, for example, the sequence of the NPPC process is applied to the plasma processing apparatus.

A detailed example of the NPPC process will now be described. First, for example, the inside of the processing chamber 2 of the plasma processing apparatus 1 shown in FIG. 1 is vacuum-sucked by using the exhaust apparatus 11. Next, for example, an exhaust valve (not shown) in an exhaust path provided in the exhaust apparatus 11 is closed. Then, the exhaust apparatus 11 is stopped. Next, while the exhaust valve is closed, a cleaning gas, for example, $N_2$ gas constituting an inert gas, is discharged into the processing chamber 2 at once from the electrode having the gas discharge function, for example, the shower head 5, at a flow rate of 2000 sccm for 30 seconds. Also, a temperature in the processing chamber 2 is, for example, 100° C. By using a gas impact force generated while discharging the $N_2$ gas, a particle attached to and a film deposited on a surface of a portion (for example, the holding stage 4 or shower head 5) inside the processing chamber 2 or an inner wall of the processing chamber 2 are detached. Next, the discharging of $N_2$ gas is stopped. Then, the detached particle or film is exhausted outside the processing chamber 2 from the processing chamber 2 by using the exhaust apparatus 11, by opening the exhaust valve.

For example, the inside of the processing chamber 2 may be cleaned via the NPPC process.

Also, an insert gas may be used as the cleaning gas in the NPPC process as described above, but alternatively, a cleaning gas generally used for cleaning, for example, a gas containing fluorine and oxygen as components, may also be used.

Such a gas may be, for example, a mixture gas of a fluorine compound and/or oxygen, and an inert gas as a carrier. Examples of the mixture gas include $NF_3/O_2/He$, $NF_3/O_2/Ar$, $NF_3/He$, $NF_3/Ar$, $COF_2/He$, $COF_2/Ar$, $CF_4/He$, $CF_4/Ar$, $CF_4/O_2/He$, and $CF_4/O_2/Ar$.

While this invention has been particularly shown and described with reference to exemplary embodiments thereof, it will be understood by those skilled in the art that various changes in form and details may be made therein without departing from the spirit and scope of the invention as defined by the appended claims.

For example, in the above embodiment, a parallel plate type capacitively-coupled plasma processing apparatus is used as the plasma processing apparatus, but the plasma processing apparatus is not limited thereto as long as the plasma processing apparatus includes the electrode having the gas discharge function. For example, the present invention may be applied to an inductively-coupled plasma processing apparatus including the electrode having the gas discharge function, a microwave plasma processing apparatus including the electrode having the gas discharge function, or the like.

Furthermore, the present invention may be variously modified within the range without departing from the main points of the present invention.

According to the present invention, the electrode having the gas discharge function, where the degree of freedom related to the maximum gas flow rate is abundant, the electrode cover member can be thinned, and it is difficult for the gas behavior to change as time passes in the processing chamber during gas introduction, and the plasma processing apparatus including the electrode can be provided.

What is claimed is:

1. An electrode having a gas discharge function, used in a plasma processing apparatus and disposed facing an electrode on which an object is held, the electrode having the gas discharge function comprising:
   a base material forming a gas diffusion space, the gas diffusion space including a bottom plate having a plurality of first gas holes; and
   an electrode cover member having a plurality of second gas holes, the electrode cover member being attached to an outer surface of the bottom plate in a way that an imaginary axis of conduit formed by one of the first gas holes and imaginary axes of conduits formed by two or more of the second gas holes are parallel to each other to be able to discharge a gas from the gas diffusion space through the first and second gas holes,
   wherein the first gas hole includes a clearance portion formed at an outer end portion of the first gas hole, the clearance portion forming a space flared towards the second gas hole; and wherein a film is coated in an inner wall of the clearance portion to prevent damage by plasma.

2. The electrode having the gas discharge function of claim 1, wherein one first gas hole of the base material and a plurality of second gas holes, of the electrode cover member, corresponding to the one first gas hole of the base material are misaligned so as not to overlap each other.

3. The electrode having the gas discharge function of claim 1, wherein a second gas hole diameter of the electrode cover member is smaller than or equal to a first gas hole diameter of the base material, and composite conductance obtained by adding conductances of a plurality of second gas holes included in one gas hole group of the electrode cover member is higher than conductance of one first gas hole of the base material, the gas hole group of the electrode cover member being defined as a group of two of more second gas holes which correspond to one first gas hole of the base material.

4. The electrode having the gas discharge function of claim 1, wherein a second gas hole diameter of the electrode cover member is larger than a first gas hole diameter of the base material.

5. The electrode having the gas discharge function of claim 1, wherein the clearance portion having a concave shape, larger than the second gas hole diameter of the electrode cover member, and including one gas hole group of the electrode cover member is formed on at least one of a surface, of the base material, attached to the electrode cover member and a surface, of the electrode cover member, attached to the base material, the gas hole group of the electrode cover member being defined as a group of two of more second gas holes which correspond to one first gas hole of the base material.

6. The electrode having the gas discharge function of claim 5, wherein a depth of an outer circumference of the clearance portion having the concave shape is shallower than a depth of an inner side of the clearance portion having the concave shape.

7. The electrode having the gas discharge function of claim 6, wherein a region where a depth of the clearance portion having the concave shape is shallower is outside the gas hole group.

8. The electrode having the gas discharge function of claim 5, wherein the film is coated by performing an abrasion tolerant coating process on a portion, of the clearance portion having the concave shape, facing the electrode cover member.

9. The electrode having the gas discharge function of claim 8, wherein the film is coated by the abrasion tolerant coating process comprises at least any one of an yttrium oxide sprayed coating film, an alumina sprayed coating film, an yttrium fluoride sprayed coating film, and an anodized coating film.

10. The electrode having the gas discharge function of claim 5, wherein a chamfered portion having a tapered shape is formed at a portion, of a second gas hole of the electrode cover member, facing the base material, wherein the chamfered portion has a hole diameter larger than the second gas hole diameter of the electrode cover member and smaller than a hole diameter of the clearance portion having the concave shape.

11. The electrode having the gas discharge function of claim 1, wherein the electrode cover member is replaceable.

12. The electrode having the gas discharge function of claim 11, wherein the replaceable electrode cover member is formed by a material comprising at least any one of quartz, alumina, an yttrium sintered body, aluminum nitride, silicon nitride, silicon carbide, silicon, and calcium fluoride.

13. The electrode having the gas discharge function of claim 1, wherein a thickness of the electrode cover member is more than or equal to 3 mm and less than or equal to 15 mm.

14. The electrode having the gas discharge function of claim 1, wherein a direction of a second gas hole of the electrode cover member is tilted in a middle of the electrode cover member.

15. The electrode having the gas discharge function of claim 14, wherein a direction of a second gas hole of the electrode cover member at the processing space is perpendicular to the processing space.

16. The electrode having the gas discharge function of claim 14, wherein a first gas hole of the base material is hidden by using a side surface of the tilted second gas hole of the electrode cover member such that the first gas hole of the base material is not seen from the processing space.

17. A plasma processing apparatus comprising:
a processing chamber in which a process is performed on an object;
a holding stage formed in the processing chamber, on which the object is held, and serving as an electrode; and
an electrode having a gas discharge function, formed in the processing chamber, and disposed facing the holding stage,
wherein the electrode having the gas discharge function comprises:
a base material forming a gas diffusion space, the gas diffusion space including a bottom plate having a plurality of first gas holes; and
an electrode cover member having a plurality of second gas holes, the electrode cover member being attached to an outer surface of the bottom plate in a way that an imaginary axis of conduit formed by one of the first gas holes and imaginary axes of conduits formed by two or more of the second gas holes are parallel to each other to be able to discharge a gas from the gas diffusion space through the first and second gas holes,
wherein the first gas hole includes a clearance portion formed at an outer end portion of the first gas hole, the clearance portion forming a space flared towards the second gas hole; and
wherein a film is coated in an inner wall of the clearance portion to prevent damage by plasma.

18. The plasma processing apparatus of claim 17, wherein the plasma processing apparatus is configured to perform a purge process during the process.

19. The plasma processing apparatus of claim 17, wherein the plasma processing apparatus is configured to perform cleaning inside the processing chamber by a gas impact force generated by introducing a cleaning gas from the electrode having the gas discharge function.

* * * * *